(12) United States Patent
Seddon

(10) Patent No.: US 11,075,118 B2
(45) Date of Patent: Jul. 27, 2021

(54) SEMICONDUCTOR DIE SINGULATION METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 21 days.

(21) Appl. No.: 16/545,668

(22) Filed: Aug. 20, 2019

(65) Prior Publication Data

US 2019/0371670 A1   Dec. 5, 2019

Related U.S. Application Data

(60) Continuation-in-part of application No. 16/141,019, filed on Sep. 25, 2018, now Pat. No. 10,403,544, which is a continuation-in-part of application No. 15/955,581, filed on Apr. 17, 2018, now Pat. No. 10,083,868, which is a division of application No.
(Continued)

(51) Int. Cl.
| | |
|---|---|
| *H01L 21/78* | (2006.01) |
| *H01L 21/033* | (2006.01) |
| *H01L 21/304* | (2006.01) |
| *H01L 21/306* | (2006.01) |
| *H01L 21/3065* | (2006.01) |
| *H01L 21/66* | (2006.01) |
| *H01L 23/00* | (2006.01) |
| *H01L 21/683* | (2006.01) |

(52) U.S. Cl.
CPC .......... *H01L 21/78* (2013.01); *H01L 21/0332* (2013.01); *H01L 21/304* (2013.01); *H01L 21/30604* (2013.01); *H01L 21/30655* (2013.01); *H01L 21/6836* (2013.01); *H01L 22/32* (2013.01); *H01L 24/14* (2013.01); *H01L 22/14* (2013.01); *H01L 24/11* (2013.01); *H01L 2221/68327* (2013.01)

(58) Field of Classification Search
CPC ........... H01L 21/0332; H01L 21/30655; H01L 21/78
See application file for complete search history.

(56) References Cited

U.S. PATENT DOCUMENTS

| | | |
|---|---|---|
| 2006/0113277 A1 | 6/2006 | Krawczyk et al. |
| 2010/0274954 A1 | 10/2010 | Ishimura et al. |
| 2011/0175225 A1 | 7/2011 | Seddon et al. |

(Continued)

*Primary Examiner* — Mounir S Amer
(74) *Attorney, Agent, or Firm* — Adam R. Stephenson, Ltd.

(57) ABSTRACT

Implementations of a method of singulating a plurality of die may include: providing a semiconductor wafer including a plurality of die where the plurality of die include a desired thickness. A passivation material may cover at least a portion of the plurality of die and the semiconductor wafer. The method may include clearing the passivation material from one or more die streets located between each of the plurality of die. The method may also include etching a plurality of trenches into the semiconductor wafer only from the first side of the semiconductor wafer. A depth of the plurality of trenches may be greater than the desired thickness of the plurality of die. The method may also include thinning a second side of the semiconductor wafer to a predetermined distance to the depth of the plurality of trenches to singulate the plurality of die.

20 Claims, 13 Drawing Sheets

Related U.S. Application Data

15/189,611, filed on Jun. 22, 2016, now Pat. No. 9,991,164.

(56) References Cited

U.S. PATENT DOCUMENTS

| | | |
|---|---|---|
| 2013/0093097 A1 | 4/2013 | Yu et al. |
| 2014/0127880 A1 | 5/2014 | Grivna |
| 2017/0170081 A1 | 6/2017 | Byun et al. |
| 2017/0179076 A1 | 6/2017 | Kamphuis et al. |

SEMICONDUCTOR DIE SINGULATION METHODS

CROSS REFERENCE TO RELATED APPLICATIONS

This application is a continuation-in-part application of the earlier U.S. Utility Patent Application to Michael J. Seddon entitled "Semiconductor Singulation Methods," application Ser. No. 16/141,019, filed Sep. 25, 2018, now pending, which is a continuation-in-part of the earlier U.S. Utility Patent Application to Michael J. Seddon entitled "Semiconductor Singulation Methods," application Ser. No. 15/955,581, filed Apr. 17, 2018, issued on Sep. 25, 2018, which is a divisional application of the earlier U.S. Utility Patent Application to Michael J. Seddon entitled "Semiconductor Singulation Methods," application Ser. No. 15/189,611, filed Jun. 22, 2016, issued Jun. 5, 2018, the disclosure of each of which are hereby incorporated entirely herein by reference.

BACKGROUND

1. Technical Field

Aspects of this document relate generally to methods for singulating semiconductor die.

2. Background

Semiconductor die (chips) contain electronic circuits and are typically fabricated simultaneously on a silicon wafer. After processing of the wafer, the die need to be separated from each other so they can be either sent for additional semiconductor packaging processing, or for inclusion into an electronic device. Some singulating techniques involve using a saw blade. Sawing is often done in two cuts, a first wider width saw blade cut followed by a second narrower width saw blade cut that fully cuts through the wafer thickness.

SUMMARY

Implementations of a method of singulating a plurality of die may include: providing a semiconductor wafer including a plurality of die located on a first side of the semiconductor wafer where the plurality of die include a desired thickness. A passivation material may cover at least a portion of the plurality of die and the semiconductor wafer. The method may include clearing the passivation material from one or more die streets located between each of the plurality of die. The method may also include etching a plurality of trenches into the semiconductor wafer only from the first side of the semiconductor wafer. The plurality of trenches may be located in one or more die streets and may be adjacent to a perimeter of the plurality of die. A depth of the plurality of trenches may be greater than the desired thickness of the plurality of die. The method may also include mounting the first side of the semiconductor wafer to a backgrinding tape. The method may also include thinning a second side of the semiconductor wafer to a predetermined distance to the depth of the plurality of trenches to singulate the plurality of die.

Implementations of a first method of singulating a plurality of die may include one, all, or any of the following:

Etching the plurality of trenches may include plasma etching.

Etching the plurality of trenches may further include defining a pattern of the plurality of trenches using passivation material, metal material, photolithographic masking, temporary film, shadow masking, or any combination thereof.

The semiconductor wafer may include silicon and etching the plurality of trenches may further include using a deep reactive ion etch (DRIE) process.

The method may further include doing one of the following after etching the plurality of trenches: forming a plurality of bumps on the plurality of die; testing one or more of the plurality of die; probing one or more of the plurality of die; adding memory data to one or more of the plurality of die; forming a solderable surface on a surface of one or more of the plurality of die, or any combination thereof.

Thinning the second side of the semiconductor wafer to the depth of the trenches may include using an edge ring grinding process.

Clearing the passivation layer may include sawing or laser cutting.

Implementations of a method of singulating a plurality of die may include providing a semiconductor wafer including a plurality of die located on a first side of the semiconductor wafer. The plurality of die may include a desired thickness. A passivation may be formed on at least a portion of the plurality of die and the semiconductor wafer. The method may include clearing the passivation material from one or more die streets located between each of the plurality of die. The method may also include etching a plurality of trenches into the semiconductor wafer only from the first side of the semiconductor wafer. The plurality of trenches may be located in the one or more die streets and may be adjacent a perimeter of the plurality of die. The depth of the plurality of trenches may be greater than the desired thickness of the plurality of die. The method may include forming a plurality of bumps on the plurality of die. The method may include mounting the first side of the semiconductor wafer to a back grinding tape. The method may also include thinning a second side of the semiconductor wafer to a predetermined distance to the depth of the plurality of trenches to singulate the plurality of die.

Implementations of the second method of singulating the plurality of die may include one, all, or any of the following:

Clearing the passivation layer may include sawing or laser cutting.

Etching the plurality of trenches may further include defining a pattern of the plurality of trenches using passivation material, metal material, photolithographic masking, temporary film, shadow masking, or any combination thereof.

The semiconductor wafer may include silicon and etching the plurality of trenches may further include using a DRIE process.

The method may further include doing one of the following after etching the plurality of trenches: testing one or more of the plurality of die, probing one or more of the plurality of die, adding memory data to one or more of the plurality of die, forming a solderable surface on a surface of one or more of the plurality of die, or any combination thereof.

Etching the second side of the semiconductor wafer to expose the plurality of trenches may further include etching using plasma etching, wet etching, or any combination thereof.

Thinning the second side of the semiconductor wafer to the depth of the trenches further comprises using an edge ring grinding process.

Implementations of a method of singulating a plurality of die may include: providing a semiconductor wafer including a plurality of die located one a first side of the semiconductor wafer. The plurality of die may include a desired thickness. A passivation material may cover at least a portion of the plurality of die and the semiconductor wafer. The method may also include clearing the passivation layer form one or more die streets located between each of the plurality of die. The method may further include etching a plurality of trenches into the semiconductor wafer only from the first side of the semiconductor wafer. The plurality of trenches may be located in the one or more die streets and may be adjacent a perimeter of the plurality of die. A depth of the plurality of trenches may be greater than the desired thickness of the plurality of die. The method may also include mounting the first side of the semiconductor wafer to a back grinding tape. The method may include thinning a second side of the semiconductor wafer to the depth of the plurality of trenches and singulating the plurality of die through thinning the second side of the semiconductor wafer. The method may include transferring the plurality of die from the back grinding tape to a transporting tape.

Implementations of the third method of singulating a plurality of die may include one, all, or any of the following:

Clearing the passivation layer may include sawing or laser cutting.

Etching the plurality of trenches may further include defining a pattern of the plurality of trenches using passivation material, metal material, photolithographic masking, temporary film, shadow masking, or any combination thereof.

The semiconductor wafer may include silicon and etching the plurality of trenches and etching may further include using a DRIE process.

The method may further include doing one of the following after etching the plurality of trenches: forming a plurality of bumps on the plurality of die, testing one or more of the plurality of die, probing one or more of the plurality of die, adding memory data to one or more of the plurality of die, forming a solderable surface on a surface of one or more of the plurality of die, or any combination thereof.

Thinning a second side of the semiconductor wafer to the depth of the trenches may further include using an edge ring grinding process.

The method may further include picking the plurality of die from the transporting tape.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
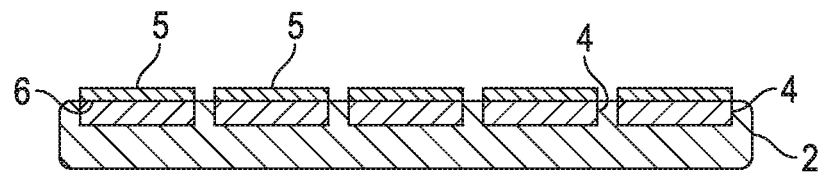
FIG. 1 is a cross section view of an implementation of a wafer with a plurality of die with a patterning material/layer thereon.

This disclosure, its aspects and implementations, are not limited to the specific components, assembly procedures or method elements disclosed herein. Many additional components, assembly procedures and/or method elements known in the art consistent with the intended method for singulating a plurality of die will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods of singulating a plurality of die, and implementing components and methods, consistent with the intended operation and methods.

During fabrication of chip scale semiconductor device packages (CSP), challenges have existed that are created as the package approaches the size of the die, including those created by elimination of the mold compound that covers the die and the use of bumped die. Some packaging technologies with more surface area can compensate for some defects in the die, such as chipouts or cracking of the die caused during the wafer sawing process (whether single pass or double pass processes). The sawing process can also create damage along the sidewalls of the die which creates cracks or stress concentration points which can later propagate through the die and cause failures in the field. The reliability issues created in CSP packages due to chipouts or die cracking increase as the thickness of the die themselves decreases. Many die used in CSP processes are thinned to about 250 microns to about 500 microns in thickness from the full wafer thickness. While alternative approaches to singulation of thinned die such as laser singulation have been proposed, they have not produced die with equivalent strength to sawn die due to reformation of the molten silicon side walls of the die into a non-single crystal structure following singulation. Because the chipouts are often on the back side of the die, they cannot be effectively visually inspected for, so prevention of the chipouts entirely would eliminate failures relating to these defects.

Various method implementations for singulating semiconductor die using in whole or in part plasma etching are disclosed in this document. These various method implementations may be effective on many different wafer types, including single crystal silicon, amorphous silicon, sapphire, silicon-on-insulator, gallium arsenide (GaAs), ruby, and any other semiconductor substrate type, provided the plasma etch chemistry is appropriate for the specific substrate type. Furthermore, the method implementations may be employed with any closed shaped substrate of any size, provided the plasma etching can be accomplished.

Where the semiconductor die include bumps (tin-silver, copper, lead-tin, etc.), attempting to use plasma etching to singulate the die on the side where the bumps are present may cause processing issues resulting from oxidation of the bump surfaces or interactions with residual materials on the bumps during the etch process, depending on the chemistry of the particular etch involved. Accordingly, processes that do not require that the bumps are present during the plasma etch process may be more desirable in some implementations to those where the bumps are in place already.

Referring to FIG. 1, an implementation of a wafer 2 with a plurality of die 4 is illustrated. While in FIG. 1, the plurality of die 4 are illustrated as being the same size and the same type of die, in various implementations, die of different sizes and types on the same wafer could be processed in various method implementations. Each die 4 is shown has having a particular thickness 6 into the material of the wafer 2. However, those of ordinary skill in the art will appreciate that this is merely for the purposes of illustrating the desired die thickness in FIG. 1, since the process of forming the die generally means the structure of the die is formed close to the surface of the wafer and on top of the surface of the wafer. Accordingly, each die 4 generally can be thinned to various thicknesses without encroaching on the active portions of the die 4 that extend into the die. Because of this, the thickness of the die is generally determined by the packaging requirements and packaging processing conditions.

Figure 2:
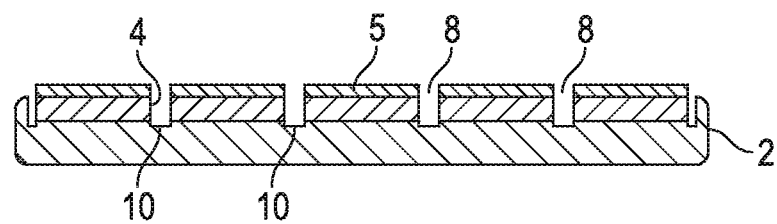
FIG. 2 is a cross section view of the wafer of FIG. 1 following etching of trenches around a perimeter of the plurality of die.

Above each die is a layer that defines a perimeter of each die. This layer may be formed of any of a wide variety of etch-resistant materials such as, by non-limiting example, passivation material, metal material (such as under bump metallization), photoresist, temporarily applied film, and any other method of patterning/providing an etch-resistant pattern on the wafer. In various implementations, shadow masking could be used to define the perimeter of each die. In such implementations where shadow masking is employed, no additional layer above each die may be needed. Once the perimeters of the die are defined/protected by the layer 5 (or shadow mask), a plasma etch process is used to etch a plurality of trenches 8 into the semiconductor wafer from the die side (first side) of the wafer. FIG. 2 illustrates the wafer 2 of FIG. 1 following the etching process, showing that the depth/bottom 10 of the plurality of trenches lies below the desired thickness of the plurality of die 4. Because in various method implementations, the plasma etch does not need to etch all the way through the full-thickness wafer, the methods may be more manufacturable and less capital intensive. As can be observed, the plurality of trenches lie adjacent to or at the perimeter of the die.

In particular implementations, the semiconductor wafer 2 is a silicon wafer and the plasma etching process is the Bosch deep reactive ion etch (DRIE) deposition/etching process that employs, by non-limiting example, an argon/sulfur hexafluoride chemistry for etching steps and trifluoromethane/argon chemistry for the alternating side wall deposition steps. In other implementations, however, other etching processes/chemistries could be used, depending upon the particular material that forms the wafer 2.

Figure 3:
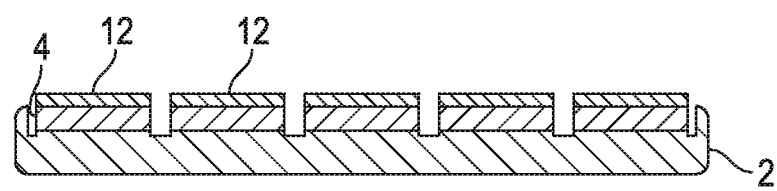
FIG. 3 is a cross sectional view of the wafer of FIG. 1 following additional processing steps.

Following the etching step, the wafer may be rinsed or otherwise cleaned to remove any remaining etchant or residue from the etching process. In various implementations, the wafer can then have a wide variety of additional processes performed to the die side of the wafer. These include, by non-limiting example, forming bumps on the die; electrically testing the die; probing the die; adding data to memory portions of the die erased by exposure to the plasma etch process; removal of the layer 5 above the die; forming a solderable surface on one or more of the die; or any other desired process that needs to be performed to the front side of the die. This is possible because the wafer still remains at full thickness and can be handled by standard wafer processing equipment. In various implementations, these additional processes may not be performed, as they may be done depending upon the nature of the particular device being formed. FIG. 3 illustrates the wafer following application of a metal interconnect layer 12 to the plurality of die 4.

Figure 4:
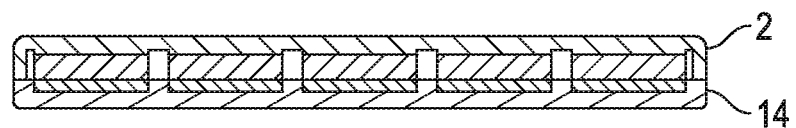
FIG. 4 is a cross sectional view of the wafer of FIG. 1 flipped over and mounted to a tape.

The wafer is then prepared for thinning. In some implementations, this is done by mounting the die side of the wafer to back grinding tape. Such an implementation is illustrated in FIG. 4. In particular implementations, the back grinding tape may be stiff relative to other back grinding tapes and may or may not be supported on a frame. In other implementations, a wafer carrier employing a substrate may be bonded to the back side (non-die side or second side) of the wafer 2. In other implementations, a wafer film frame may be employed with the various tapes. In some implementations, the front side of the wafer may be coated with a protective layer prior to be mounted to the tape. This protective layer could be a photoresist or other removable polymer or other material.

Figure 5:
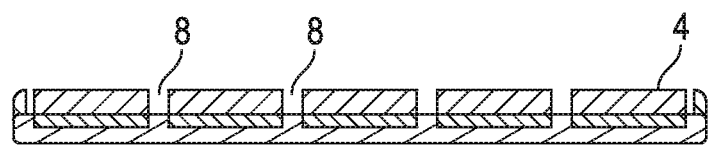
FIG. 5 is a cross sectional view of the wafer of FIG. 1 following thinning of a second side of the wafer, exposing the bottoms of the plurality of trenches, and singulation of the plurality of die.

Thinning of the wafer can be accomplished by several different techniques. Back grinding may be used, which may include grinding across the full diameter of the wafer or grinding using the Taiko process developed by Disco Hi-Tec America, Inc. of Santa Clara, Calif. The Taiko process leaves a ring of thick wafer material (Taiko ring) around the outer edge of the backside of the wafer and grinds the center of the wafer down to the desired die thickness. In various method implementations, the thickness of the ring may be about 3 mm. In other implementations, wet chemical etching or plasma bulk etching of the material of the backside (second side) of the wafer may be employed either alone or in combination with back grinding to thin the wafer. As is illustrated in FIG. 5, the plurality of die 4 have been singulated through the wafer thinning operation as the bottoms of the plurality of trenches 8 have been exposed at the point the thinning reached the desired thickness for the plurality of die 4 and fully removed the excess wafer material. The singulated plurality of die are now attached to the back grinding tape.

Figure 6:
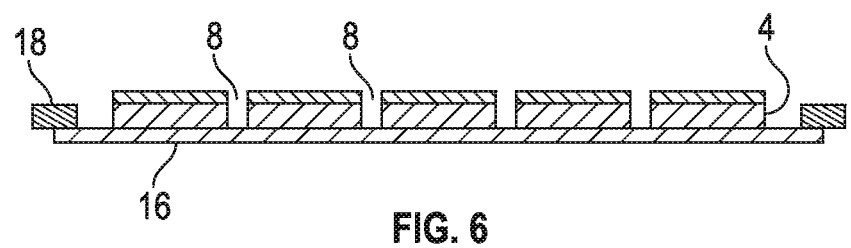
FIG. 6 is a cross sectional view of the plurality of die of FIG. 5 flipped over and mounted on a picking tape attached to a frame.

In various method implementations, additional processing steps could be employed to process the back sides of the plurality of die. By non-limiting example, these steps could include laser marking, stress relief etching of the die (wet etching, gas/fuming etching, plasma etching); washing of the die; application of die attach film, application of die bonding materials, any combination thereof, or any other desired die backside processing technique. In some implementations, the die may be picked directly from the back grinding tape. In other implementations, the die may be flipped by being transferred from the back grinding tape to a picking tape for die picking. As illustrated in FIG. 6, this picking tape 16 may be supported by a frame 18 and the plurality of die 4 and plurality of trenches 8 are now facing front side up again.

Various method implementations like those illustrated in FIGS. 1-6 may be employed using wafer thinning equipment which is capable of carrying out the wafer singulation method on a single tool that can thin the wafer to singulate the plurality of die and also place the die on a film frame without having to use a separate mounting process tool. For example, the tool may thin the wafer, rinse it, and then transfer the singulated die from the back grinding tape to picking film all while the wafer is in the same tool.

Figure 7:
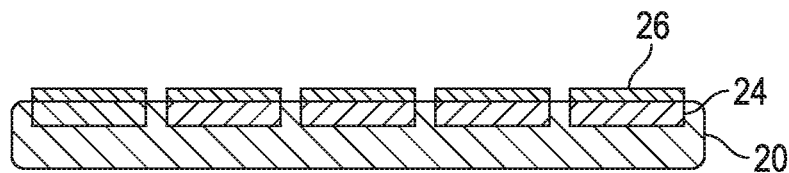
FIG. 7 is a cross sectional view of another implementation of a wafer with a plurality of die with a patterning material thereon.
Figure 8:
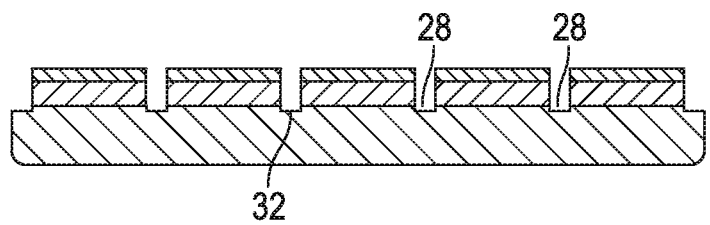
FIG. 8 is a cross sectional view of the wafer of FIG. 7 following etching of trenches around the perimeter of the plurality of die.
Figure 9:
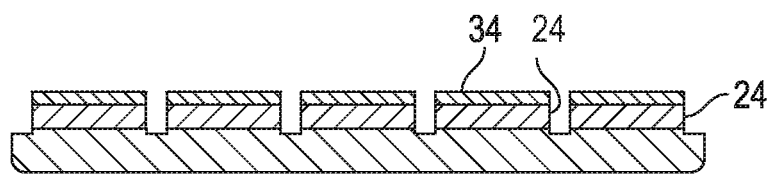
FIG. 9 is a cross sectional view of the wafer of FIG. 7 following additional processing steps

Referring to FIG. 7, another implementation of a wafer 20 that includes a plurality of die 24 each with a layer 26 covering a perimeter of the die 24 is illustrated. This wafer 20 may be any type of substrate disclosed in this document, and the die 24 may also be any disclosed herein. FIG. 8 illustrates the wafer 20 following plasma etching where the plurality of trenches 28 with bottoms 32 deeper than the predetermined thickness 30 of the plurality of die have been created. In FIG. 8, the edge of the wafer shows that it has been completely etched away, which may be done in some implementations. However, in FIG. 8 and subsequent figures, the edge is not shown just for the purposes of simplifying illustration of the method. Any of the previously discussed additional processes may be performed to the front side of the wafer at this point in the process. FIG. 9 illustrates the plurality of die 24 following application of a metallization layer 34 to the die.

Figure 10:
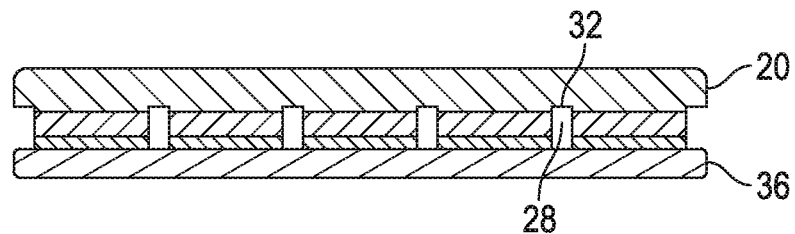
FIG. 10 is a cross sectional view of the wafer of FIG. 7 flipped over and mounted to a back grinding tape.
Figure 11:
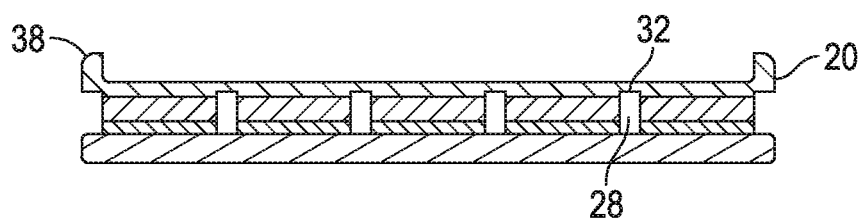
FIG. 11 is a cross sectional view of the wafer of FIG. 7 following thinning of the second side of the wafer using a Taiko back grinding process.

Following etching, the wafer 20 may be rinsed and then mounted with the front side coupled to back grinding tape 36 as illustrated in FIG. 10. In this method implementation, the wafer 20 is then thinned to the point where a predetermined distance between the second (back) side of the wafer and the bottom (depth) 32 of the plurality of trenches 28 is reached (partially thinned). As illustrated in FIG. 11, the back grinding technique used for the wafer 20 was the Taiko process and the Taiko ring 38 can be observed on the back side of the wafer. However, any of the other back grinding or etching processes previously discussed could also be used to partially thin the wafer in various method implementations. In particular implementations, the predetermined distance between the bottoms 32 of the plurality of trenches 28 and the second side of the wafer after the partial thinning process may be between about 25 microns to about 100 microns. In some implementations where Taiko grinding is used, the predetermined distance may be between about 25 microns to about 35 microns.

Figure 12:
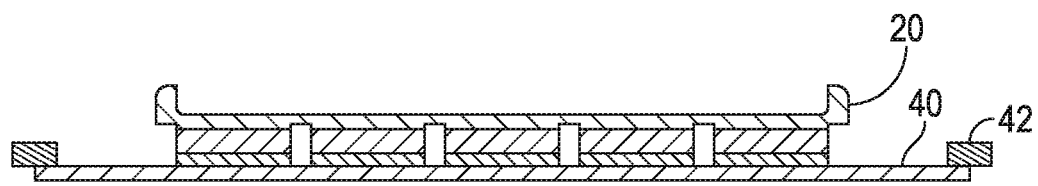
FIG. 12 is a cross sectional view of the wafer of FIG. 7 following demounting of the wafer from the back grinding tape and mounting to a picking tape attached to a frame.
Figure 13:
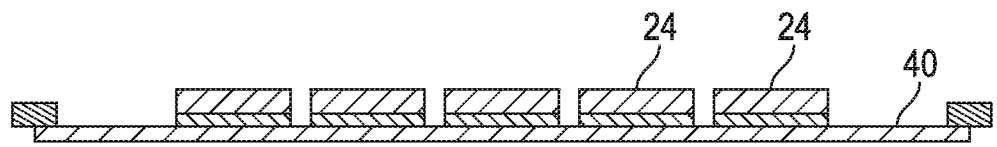
FIG. 13 is a cross sectional view of the wafer of FIG. 7 following etching or grinding of the second side of the wafer, exposing the bottoms of the plurality of trenches, and singulating the plurality of die.

Referring to FIG. 12, the wafer 20 is shown following being demounted from the back grind tape and mounted, first side down, to a picking tape 40 supported by a frame 42. At this point, the back side of the wafer is either etched or ground to remove the remaining material of the wafer to expose the plurality of trenches and thereby singulate the plurality of die from each other. In various implementations, this may involve removing the Taiko ring, then using plasma or wet etching to remove the silicon. While any etching process disclosed in this document could be used at this point, generally Bosch plasma etching would not be used here, as it would unnecessary to remove only bulk material. FIG. 13 illustrates the singulated plurality of die 24 on the picking tape 40 following the singulation process. The die 24 can now be picked directly from the picking tape. In some implementations, the wafer 20 may not be demounted from the back grind tape and mounted to picking tape, so the process of completing the singulation may take place while the wafer 20 is still mounted to the back grind tape 36. In these implementations, the plurality of die 24 may be picked directly from the back grind tape 36.

Figure 14:
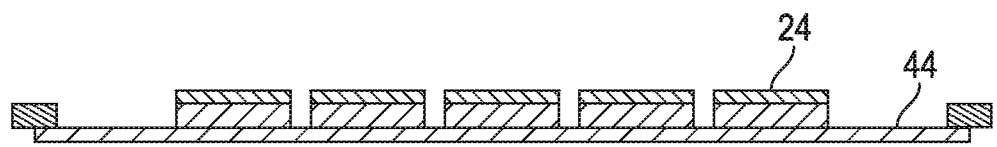
FIG. 14 is a cross sectional view of the plurality of die of FIG. 13 flipped onto another picking/transporting tape.

Any of the subsequent processes discussed in this document used for processing the plurality of singulated die may be utilized in various method implementations, such as laser marking, stress relief etching, washing, applying die attach film, and so forth. In some implementations, the die 24 may be flipped from the back grinding tape or original die picking tape to another picking or other transporting tape 44 as illustrated in FIG. 14.

This method implementation may be useful as it may be less capital intensive, as multiple process tools can be involved since the use of the Taiko process permits the thinned wafer to be moved from one process tool to another. Accordingly, full in-line equipment may not be necessary for use with this method implementation.

Figure 15:
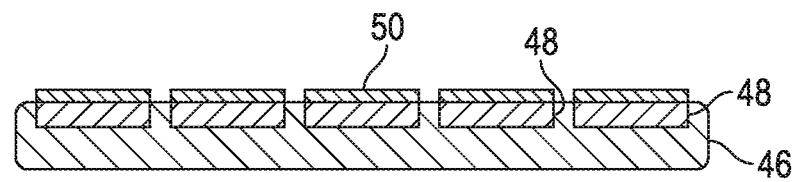
FIG. 15 is a cross sectional view of another implementation of a wafer with a plurality of die with a patterning material thereon.
Figure 16:
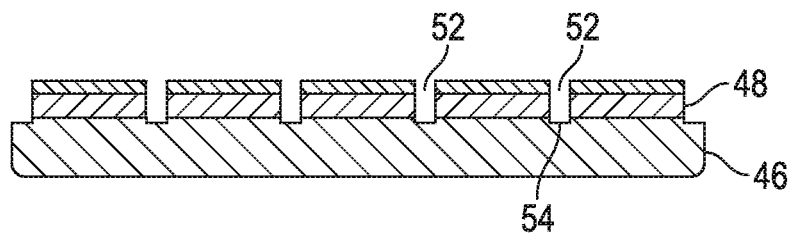
FIG. 16 is a cross sectional view of the wafer of FIG. 15 following etching of trenches around the perimeter of the plurality of die.
Figure 17:
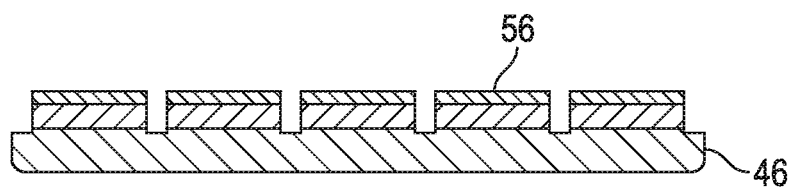
FIG. 17 is a cross sectional view of the wafer of FIG. 15 following additional processing steps.
Figure 18:
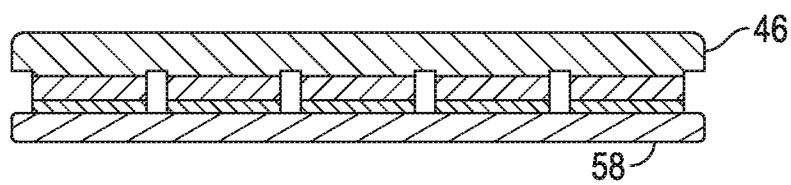
FIG. 18 is a cross sectional view of the wafer of FIG. 15 flipped over and mounted to a back grinding tape.

Referring to FIG. 15, another implementation of a wafer 46 with a plurality of die 48 each including a layer 50 that defines/protects the perimeters of the plurality of die 48 is illustrated. FIG. 16 illustrates the wafer 46 following plasma etching of a plurality of trenches 52 into the wafer 46. As previously discussed, the bottoms 54 of the plurality of trenches 52 are located below the desired thickness of the die 48. The etching of the wafer 46 can take place using any of the methods disclosed in this document, though in particular implementations, the Bosch process is used. Any of the front side wafer processing options previously discussed in this document may then be carried out (bumping, testing, probing, etc.). FIG. 17 illustrates the wafer 26 after a metallization layer 56 has been applied. The wafer 46 is then mounted to back grinding tape 58 front side down, as illustrated in FIG. 18.

Figure 19:
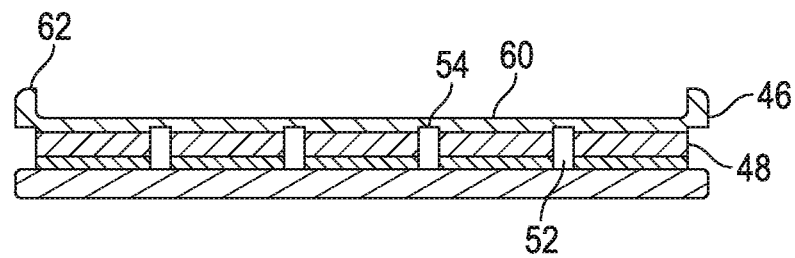
FIG. 19 is a cross sectional view of the wafer of FIG. 15 following thinning of the second side of the wafer using a Taiko back grinding process.

The wafer 46 is then thinned from the back side (second side) using any of the grinding/etching process disclosed herein until the back side 60 reaches a predetermined distance between the back side 60 and the bottom 54 of the plurality of trenches 52. In various implementations, Taiko back grinding may be used, though standard back grinding could also be used along with bulk plasma etching or wet chemical etching. Where Taiko grinding is used, the predetermined distance may be about 25 microns to about 100 microns. In some implementations, a wafer carrier could be coupled with the wafer as a processing aid. At this point, in this method implementation, any of the previously disclosed processes for treating the back side of the plurality of singulated die may be carried out on the back sides of the plurality of die 48. These include, by non-limiting example, laser marking, stress relief etching, washing, applying die attach film, and any other disclosed herein. FIG. 19 illustrates a wafer 46 that has been Taiko process ground showing the Taiko ring 62.

Figure 20:
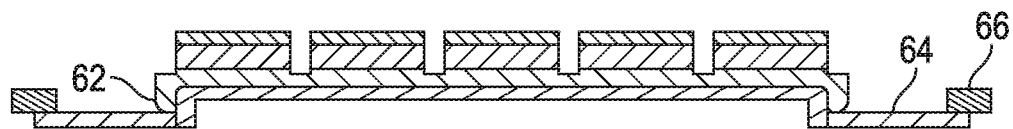
FIG. 20 is a cross sectional view of the wafer of FIG. 15 following demounting of the wafer from the back grinding tape and mounting to a picking tape attached to a frame.

Following partial thinning of the wafer 46, the front side of the wafer 46 may be demounted from the back grinding tape and then the back side (second side) of the wafer 46 may be mounted to a picking tape 64 supported by a frame 66. As illustrated in FIG. 20, this process can be done with the Taiko ring 62 in place, though in some implementations, the Taiko ring 62 may be removed following mounting using a circular saw cut process. The particular picking tape 64 may be a UV cure tape or a UV release tape in various implementations. In some implementations, a picking tape 64 may not be used but a substrate carrier/wafer carrier may be bonded to the wafer 46 or another wafer may be bonded to the wafer 46. In some implementations, the other wafer may be one which includes a plurality of die to be included in the finished semiconductor package. In various method implementations, the wafer with the back grinding tape will be mounted to the picking tape 64 first and then the back grinding tape is then removed. In these situations, it may be easier for the operator or equipment to remove the back grinding tape while the wafer is already mounted on a frame to the picking tape.

Figure 21:
FIG. 21 is a cross sectional view of the wafer of FIG. 15 following removal of the Taiko ring.
Figure 22:
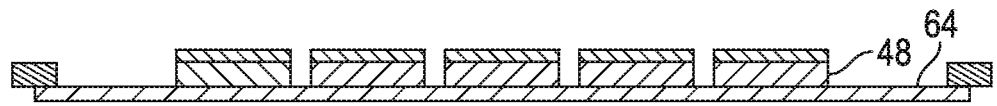
FIG. 22 is a cross sectional view of the wafer of FIG. 15 following etching of the wafer at the plurality of trenches to singulate the plurality of die.

FIG. 21 illustrates the wafer 46 following removal of the Taiko ring 62. At this point, the remaining wafer material of the predetermined distance between the bottom 54 of the plurality of trenches 52 and the back side of the wafer 6 is etched or ground away. In particular implementations, etching process used is the Bosch process. In other implementations, wet etching could be used, or the wafer 46 may be flipped or otherwise mounted to allow for additional back grinding to take place. During the etching/grinding process the bottoms 54 of the plurality of trenches 52 are extended through the wafer 46 until the plurality of trenches 52 extend completely through the wafer 46 and the plurality of die 48 are singulated. Also, where the Taiko ring is still present, the etching process will singulate the Taiko ring from the wafer at the same time the plurality of trenches are exposed. FIG. 22 illustrates the plurality of die 48 following the singulation process attached to the picking tape 64. Since these die 48 are already front side up, they may not need to be flipped for die picking but are already to be picked directly from the picking tape 64. However, they could be transferred to another transfer tape as previously discussed in various method implementations.

This method implementation may be useful in situations where capital equipment is not available that would allow for wafer flipping and where the devices in the die can withstand the effects of the additional plasma wafer processing from the front side of the wafer.

Figure 23:
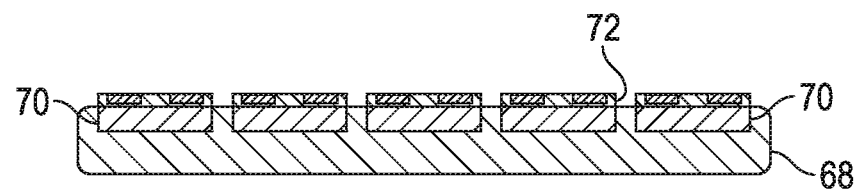
FIG. 23 is a cross sectional view of a wafer having a plurality of die where each die includes an under bump metal layer.
Figure 24:
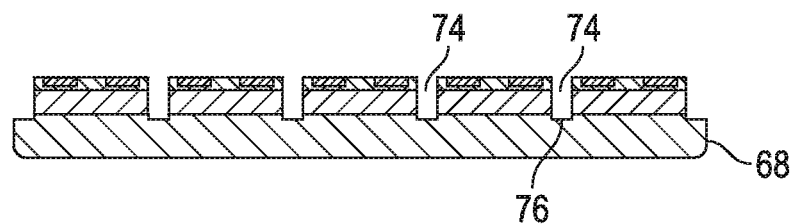
FIG. 24 is a cross sectional view of the wafer of FIG. 23 following etching of trenches around the perimeter of the plurality of die.
Figure 25:
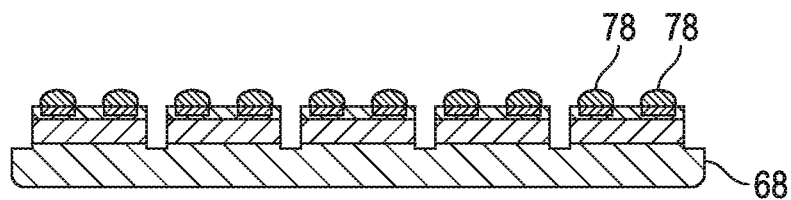
FIG. 25 is a cross sectional view of the wafer of FIG. 23 following formation of a plurality of bumps on the under bump metal layer of the various die of the plurality of die.

Referring to FIG. 23, another implementation of a wafer 68 is illustrated. In this implementation, the wafer 68 includes a plurality of die 70 each of which includes a layer of under bump metal (UBM, bump metal layer) 72 along with associated passivation layer material which defines the perimeter of the die 70. The passivation layer material may be an organic material such as, by non-limiting example, a polyimide, a benzo-cyclo-butene (BCB) material, a resin material, silicon dioxide, silicon nitride, or any other material capable of protecting the area of the die around the UBM. The UBM 72 in combination with the passivation layer material serves as an etching mask during the following plasma etching process, which may be any disclosed in this document. FIG. 24 illustrates the wafer 68 following plasma etching showing the formed plurality of trenches 74, each with a bottom 76 that is below the desired thickness of the die as previously described. In various implementations, one or more bumps 78 are formed on the UBM 72 through any of a wide variety of process including, by non-limiting example, ball dropping, solder stenciling, electroplating, electroless plating, and any other process capable of forming bumps or stud bumps. After formation of the bumps 78, any of the front side processes disclosed in this document may be employed, such as testing, probing, adding memory, etc. In some implementations, however, one or more of the front side processes may be carried out before the bumps 78 are formed on the UBM 72.

Figure 26:
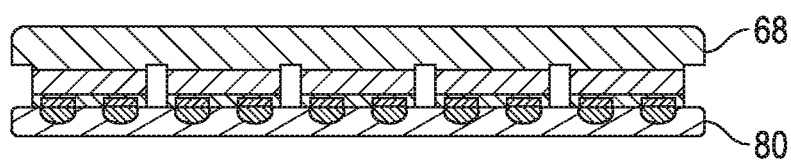
FIG. 26 is a cross sectional view of the wafer of FIG. 23 following mounting of the wafer to a back grinding tape.
Figure 27:
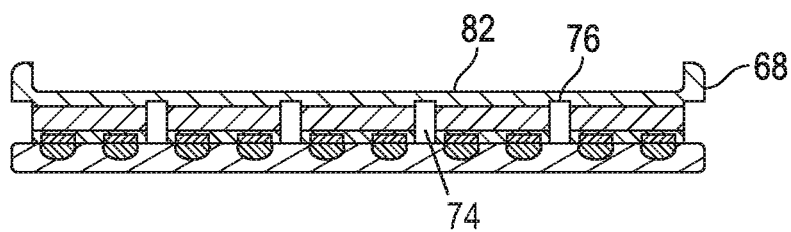
FIG. 27 is a cross sectional view of the wafer of FIG. 23 following thinning of the second side (back side) of the wafer using a Taiko grinding process.
Figure 28:
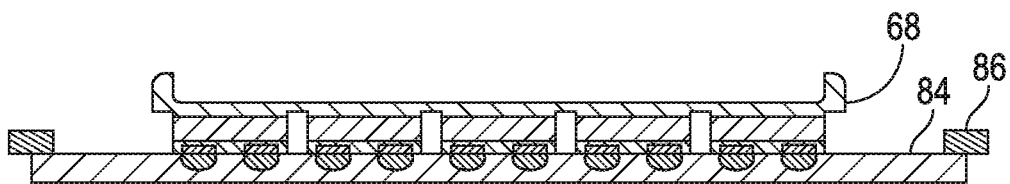
FIG. 28 is a cross sectional view of the wafer of FIG. 23 following demounting of the wafer from the back grinding tape and mounting of the first side of the semiconductor wafer to a picking tape.

The wafer 68 is then mounted to a back grinding tape 80, bump side down, as illustrated in FIG. 26. The wafer 68 can then be thinned until the back side 82 reaches a predetermined distance between the back side 82 and the bottom 76 of the plurality of trenches 74. Any of the grinding/etching processes disclosed in this document may be used for the partial thinning process. In various implementations, the predetermined distance is about 25 microns to about 100 microns. In implementations where Taiko grinding is used, the predetermined distance may be about 25 microns to about 35 microns. FIG. 27 illustrates the wafer following the thinning operation where the thinning has been done using Taiko grinding. In various implementations, the wafer 68 is then demounted from the back grinding tape 80 and mounted to picking tape 84 supported by a frame 86 with the front side of the wafer 68 down, as illustrated in FIG. 28. In various implementations, the picking tape 84 may be UV cure or UV release tape. In other implementations, however, picking tape 84 may not be used and the wafer 68 may be bonded to a substrate carrier or other wafer as previously described.

Figure 29:
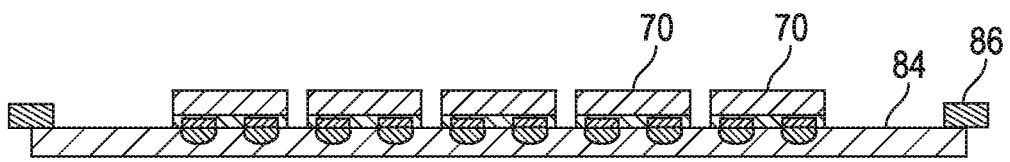
FIG. 29 is a cross sectional view of the wafer of FIG. 23 following etching or grinding in the second side of the semiconductor wafer to expose the bottoms of the plurality of trenches thereby singulating the plurality of die.
Figure 30:
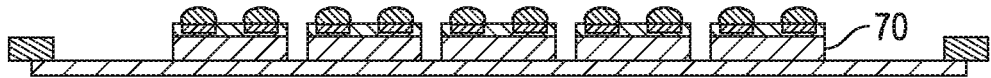
FIG. 30 is a cross sectional view of the wafer of FIG. 23 flipped onto another picking/transporting tape.

In some implementations where Taiko grinding was used, the Taiko ring is then removed using any of the processes disclosed in this document. At this point, the remaining material of the wafer 68 is etched using any process disclosed in this document until the bottoms 76 of the plurality of trenches 74 are exposed, thereby singulating the plurality of die 70, as illustrated in FIG. 29. Since the die 70 are supported by the picking tape 84, they may be directly picked from the tape, or any of the previously disclosed operations may be used to additionally process the back sides of the die, such as, by non-limiting example, laser marking, stress relief etching, washing, adding die attach film, and so forth. In some implementations, the die 70 will be flipped onto another picking or transport tape for die picking or transporting. In some implementations, the die will be placed into another carrier, such as a waffle pack for subsequent processing. FIG. 30 illustrates the plurality of die 70 flipped onto another die picking tape, now with the bump side of the die up.

In various method implementations, the UBM 72 may be formed and in place before the trenches are etched. However, in other implementations, the trenches could be formed first and the UBM then formed on the die. This may be accomplished, by non-limiting example, by using an electroless plating process, such as a nickel/gold process to form the UBM. Because electroless plating does not require an electrical connection to the back side of the plurality of die, the metal can still be deposited even when the die are electrically isolated through the plurality of trenches.

Figure 31:
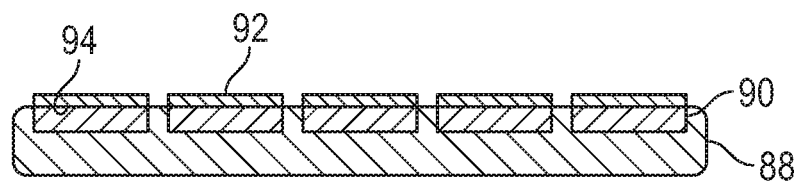
FIG. 31 is a cross section view of an implementation of a wafer with a plurality of die with a patterning material/layer thereon.

Referring to FIG. 31, an implementation of a wafer 88 with a plurality of die 90 is illustrated. The plurality of die are located on a first side of the die. While in FIG. 31, the plurality of die 90 are illustrated as being the same size and the same type of die, in various implementations, die of different sizes and types on the same wafer could be processed in various method implementations. Each die 90 illustrated has a particular thickness 94 into the material of the wafer 88. Each die 90 may be thinned to various thicknesses without encroaching on the active portions of the die 90 that extend into the die.

Included above each die is a layer of etch-resistant material that defines a perimeter of each die. In various implementations, this layer may be formed of any of a wide variety of materials such as, by non-limiting example, passivation material, metal material (such as under bump metallization), photoresist, temporarily applied film, and any other method of patterning/providing an etch-resistant pattern on the wafer. In various implementations, shadow masking could be used to define the perimeter of each die.

Figure 32:
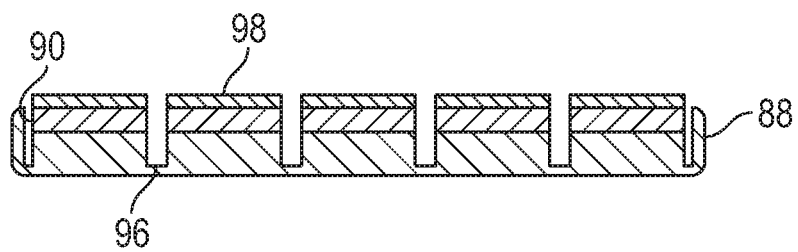
FIG. 32 is a cross section view of the wafer of FIG. 31 following etching of trenches around a perimeter of the plurality of die.

Referring to FIG. 32, a plasma etch process is used to etch a plurality of trenches 96 into the semiconductor wafer from the die/active side (first side) of the wafer. In this particular implementation of a method of singulating die from a semiconductor wafer, etching is performed only once. Therefore, the trenches must have a depth that is large enough to allow singulation through a thinning process. The trenches, therefore, are etched more deeply that the desired final thickness of the die.

In particular implementations, the semiconductor wafer 88 is a silicon wafer and the plasma etching process is the Bosch deep reactive ion etch (DRIE) process. As previously described the Bosch DRIE is a deposition/etching process that employs, by non-limiting example, an argon/sulfur hexafluoride chemistry for etching steps and trifluoromethane/argon chemistry for the alternating side wall deposition steps. In other implementations, however, other etching processes/chemistries could be used, depending upon the particular material that forms the wafer 88.

Figure 33:
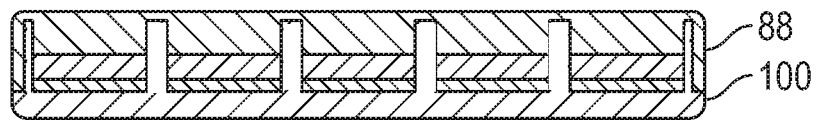
FIG. 33 is a cross sectional view of the wafer of FIG. 31 flipped over and mounted to a tape.

Referring to FIG. 33, the wafer 88 may be prepared for thinning through mounting to a back grinding tape 100. As illustrate, the first side of the wafer 88 is mounted directly to the back grinding tape. In particular implementations, the back grinding tape may be stiff relative to other back grinding tapes and may or may not be supported on a frame. In other implementations, a wafer carrier employing a substrate may be bonded to the back side (non-die side or second side) of the wafer 88. In other implementations, a wafer film frame may be employed with the various tapes. In some implementations, the front side of the wafer may be coated with a protective layer prior to be mounted to the tape. This protective layer could be a photoresist or other removable polymer or other material.

Figure 34:
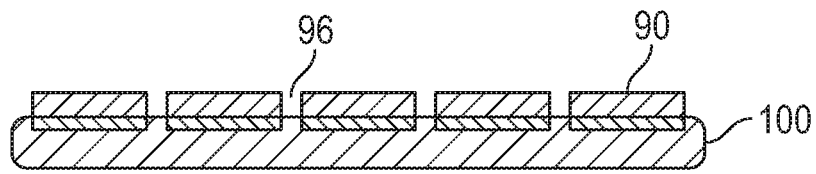
FIG. 34 is a cross sectional view of the wafer of FIG. 31 following thinning of a second side of the wafer singulating of the plurality of die.

Thinning of the wafer may be accomplished by several different techniques. Back grinding may be used, which may include grinding across the full diameter of the wafer or grinding using the Taiko process as previously described to form an edge ring. In other implementations, wet chemical etching or plasma bulk etching of the material of the second side of the wafer may be employed either alone or in combination with back grinding to thin the wafer. In FIG. 34, thinning a second side of the semiconductor wafer to the depth of the plurality of trenches is illustrated. The singulated plurality of die 90 are illustrated attached to the back grinding tape 100.

Figure 35:
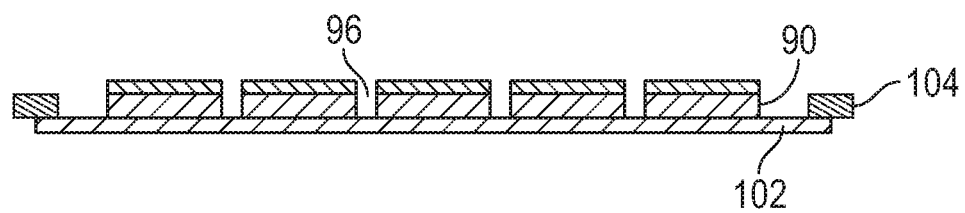
FIG. 35 is a cross sectional view of the plurality of die of FIG. 34 flipped over and mounted on a picking tape attached to a frame.
Figure 36:
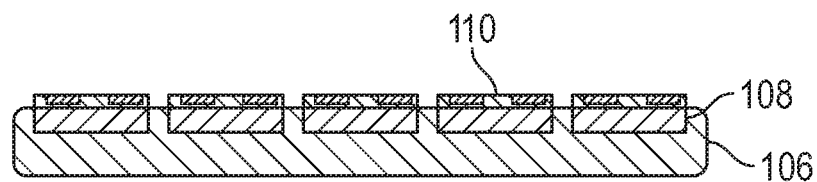
FIG. 36 is a cross sectional view of a wafer having a plurality of die where each die includes an under bump metal layer.

In some implementations, the die may be picked directly from the back grinding tape. In other implementations, the die may be flipped by being transferred from the back grinding tape to a picking tape for die picking. As illustrated in FIG. 35, this picking tape 102 may be supported by a frame 104 and the plurality of die 90 and plurality of trenches 96 are facing front side up.

Referring to FIGS. 36-41, another implementation of a method of singulating a wafer 100 into a plurality of die 108 is illustrated. In this implementation, each die 108 including a layer of under bump metal (UBM, bump metal layer) along with associated passivation layer material which defines the perimeter of the die 108. The passivation layer material may be an organic material such as, by non-limiting example, a polyimide, a benzo-cyclo-butene (BCB) material, a resin material, silicon dioxide, silicon nitride, or any other material capable of protecting the area of the die around the UBM. As previously described, the UBM 108 in combination with the passivation layer material serves as an etching mask during the following plasma etching process, which may be any disclosed in this document.

Figure 37:
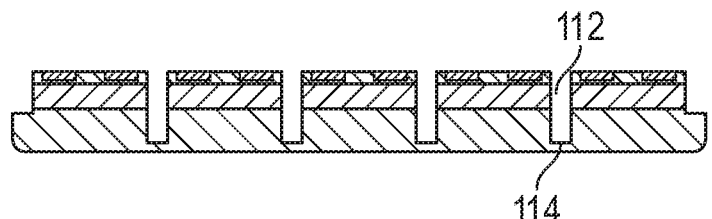
FIG. 37 is a cross sectional view of the wafer of FIG. 36 following etching of trenches around the perimeter of the plurality of die.
Figure 38:
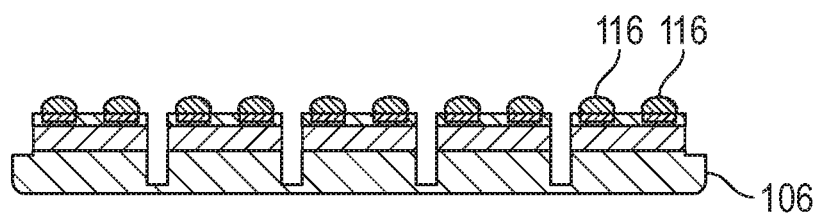
FIG. 38 is a cross sectional view of the wafer of FIG. 36 following formation of a plurality of bumps on the under bump metal layer of the various die of the plurality of die.

FIG. 37 illustrates the wafer 106 following plasma etching showing the formed plurality of trenches 112. The plurality of trenches may extend a predetermined depth that allows singulation of the plurality of die using thinning. In this particular implementation of a singulation method, etching is performed only once. Referring to FIG. 38, one or more bumps 116 are formed on the UBM through any of a wide variety of processes including, by non-limiting example, ball dropping, solder stenciling, electroplating, electroless plating, and any other process capable of forming bumps or stud bumps. In other implementations of the method, the die may not have UBM and the bumps may be formed directly on the die 108 or the die pads or metal lines themselves.

Figure 39:
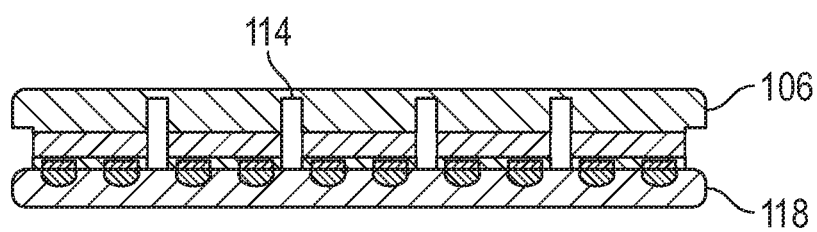
FIG. 39 is a cross sectional view of the wafer of FIG. 36 following mounting of the wafer to a back grinding tape.
Figure 40:
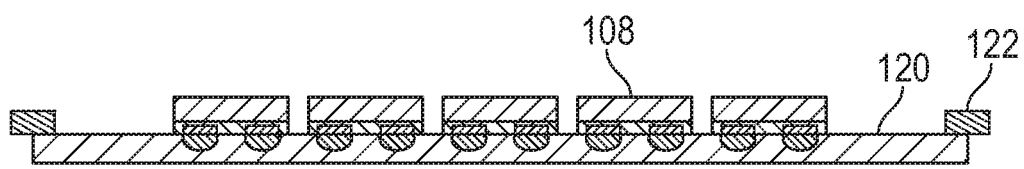
FIG. 40 is a cross sectional view of the wafer of FIG. 36 following thinning of the second side of the wafer to singulate the plurality of die.

The method may further include mounting the wafer 106 to a back grinding tape 118, bump side down, as illustrated in FIG. 39. In various implementations, the bumps may include a metal such as, by non-limiting example, gold, solder, tin, lead, copper, any combination thereof, or any other metal used in semiconductor interconnects. Referring to FIG. 40, the wafer 106 may be thinned to the depth of the trenches 114. Thinning the semiconductor wafer to the depth of the trenches results in singulating the plurality of semiconductor wafers. In various implementations, the plurality of die may be demounted from the back grinding tape directly. In other implementations, the plurality of die may be flipped and transferred to a picking tape before being further processed. In various implementations, the picking tape 120 may be UV cure or UV release tape. In other implementations, however, picking tape 120 may not be used and the wafer may be bonded to a substrate carrier or other wafer before grinding as previously described.

Figure 41:
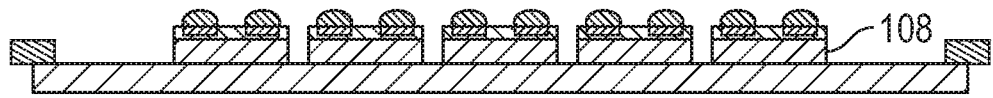
FIG. 41 is a cross sectional view of the wafer of FIG. 36 flipped onto another picking/transporting tape.

In various implementations, back grinding may include forming an edge ring around the perimeter of the wafer (such as using the Taiko process previously disclosed herein). The edge ring may be integral to the wafer and may provide support to the wafer and the plurality of die. The method may further include removing any remaining material of the wafer through etching using any process disclosed in this document. Since the die 108 are supported by the picking tape 120, they may be directly picked from the tape, or any of the previously disclosed operations may be used to additionally process the back sides of the die, such as, by non-limiting example, laser marking, stress relief etching, washing, adding die attach film, and so forth. In some implementations, the die 120 will be flipped onto another picking or transport tape for die picking or transporting. In some implementations, the die will be placed into another carrier, such as a waffle pack for subsequent processing. FIG. 41 illustrates the plurality of die 108 flipped onto another die picking tape, now with the bump side of the die up.

In various method implementations, the UBM may be formed and in place before the trenches are etched. However, in other implementations, the trenches could be formed first and the UBM then formed on the die. This may be accomplished, by non-limiting example, by using an electroless plating process, such as a nickel/gold process to form the UBM. Because electroless plating does not require an electrical connection to the back side of the plurality of die, the metal can still be deposited even when the die are electrically isolated through the plurality of trenches.

Figure 42:
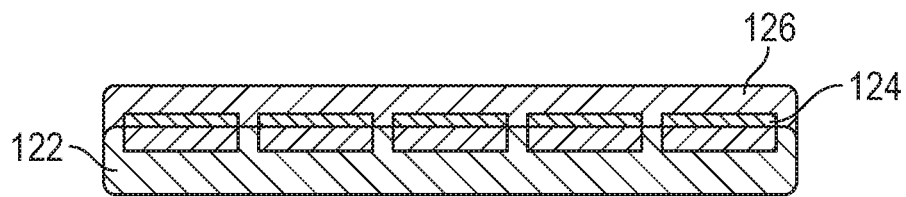
FIG. 42 is a cross sectional view of an implementation of a semiconductor wafer having a plurality of die and a passivation material over the wafer and the plurality of die.

Referring to FIGS. 42-46, various semiconductor packages are illustrated during wafer-scale processing of a wafer after various method steps of an implementation of a method of forming semiconductor packages. The method includes providing a semiconductor wafer having a plurality of die including a thickness located on a first side of the semiconductor wafer. In various implementations, the semiconductor wafer may include, by non-limiting example, silicon, silicon dioxide, silicon carbide, or any other semiconductor substrate type. As illustrated, a passivation layer 126 is also formed over the first surface of the semiconductor wafer and the plurality of die. In various implementations, the method may include forming the passivation layer over the plurality of die. In other implementations, the semiconductor wafer and die may already have a passivation layer formed thereon. Referring to FIG. 42, an implementation of a semiconductor wafer 122 having a plurality of die 124 and a passivation material 126 covering the plurality of die and the semiconductor wafer is illustrated. The passivation layer may include a metal oxide material such as, by non-limiting example, silicon nitride, aluminum oxide, polyimide, any combination thereof, or any other material designed to passivate the surface of a fabricated semiconductor device. The passivation layer may be formed using various methods, including, by non-limiting example, by coating, spraying, etching, depositing, any combination thereof, or other methods for forming passivation materials.

Figure 43:
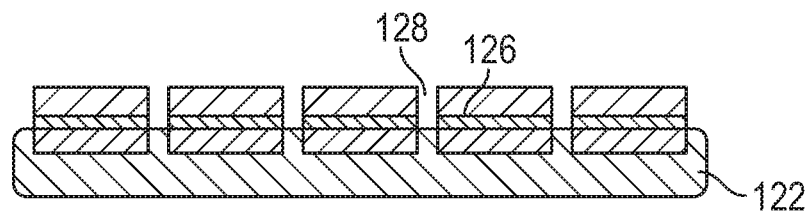
FIG. 43 is a cross sectional view of an implementation of a semiconductor wafer having a plurality of die after cutting a portion of the passivation layer from the die streets.
Figure 44:
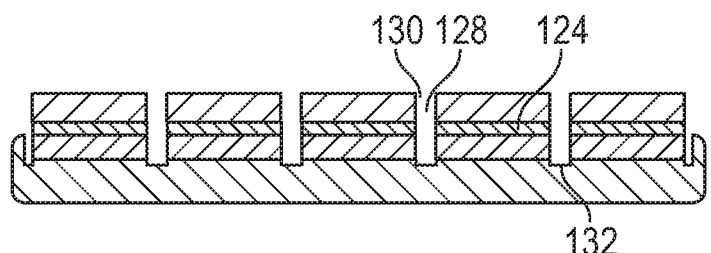
FIG. 44 is a cross sectional view of an implementation of a semiconductor wafer having a plurality of die after trenches have been formed in the semiconductor wafer between each of the plurality of die.

The method also includes clearing the passivation material from one or more die streets between each of the plurality of die. Referring to FIG. 43, the semiconductor wafer 122 is illustrated after removal of the passivation layer 126 from the die streets 128. In various implementations, the passivation layer may be removed through, by non-limiting example, sawing, laser cutting, laser ablating, etching, any combination thereof, or any other method of removing the material of the passivation layer. The method further includes etching a plurality of trenches into the semiconductor wafer from the first side of the semiconductor wafer. Referring to FIG. 44, the plurality of trenches 130 are located in the die streets 128 and are adjacent to the perimeter of the plurality of die 124. As illustrated, the plurality of trenches have a depth 132 that is greater than the desired thickness of the plurality of die 124. In various implementations, the trenches may be etched using plasma etching. In some implementations, etching the trenches may also include defining a pattern of the plurality of trenches using one of passivation material, metal material, photolithographic masking, temporary film, shadow masking, and any combination thereof. In implementations where the semiconductor wafer includes silicon, etching the plurality of trenches may involve using a deep reactive ion etch (DRIE) process.

Figure 45:
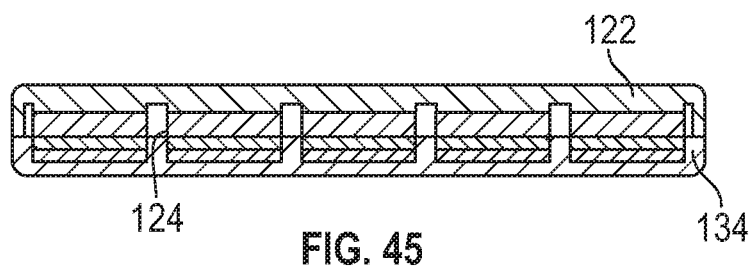
FIG. 45 is a cross sectional view of an implementation of a semiconductor wafer having a plurality of die coupled with a mounting tape after thinning of the semiconductor wafer.

After etching the plurality of trenches, the method may also include forming a plurality of bumps on the plurality of die, testing one or more of the plurality of die, probing one or more of the plurality of die, adding memory data to one or more of the plurality of die, forming a solderable surface on a surface of one or more of the plurality of die, or any combination thereof. The method also includes mounting the first side of the semiconductor wafer to a back grinding tape. The mounting tape may be any tape type described herein. Referring to FIG. 45, the semiconductor wafer 122 and the plurality of die 124 are illustrated coupled with a mounting tape 134. In various implementations, the mounting tape 134 may be supported on a frame.

Figure 46:
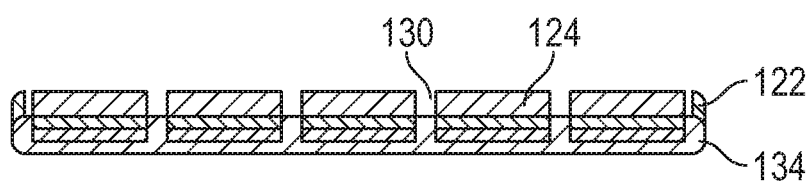
FIG. 46 is a cross sectional view of an implementation of a plurality of die coupled with a mounting tape.

The method also includes thinning a second side of the semiconductor wafer. The semiconductor wafer is thinned to singulate the plurality of semiconductor die. As previously described in this document, thinning of the wafer may be accomplished by several different techniques. Back grinding may be used, which may include grinding across the full diameter of the wafer or grinding using the Taiko process to form an edge ring. In other implementations, wet chemical etching or plasma bulk etching of the material of the second side of the wafer may be employed either alone or in combination with back grinding to thin the wafer. In FIG. 46, the wafer after thinning a second side of the semiconductor wafer to the depth of the plurality of trenches is illustrated. The resulting singulated plurality of die 124 are illustrated attached to the mounting tape 134 (which in this case may be a backgrinding tape).

In places where the description above refers to particular implementations of methods of singulating die and implementing components, sub-components, methods and sub-methods, it should be readily apparent that a number of modifications may be made without departing from the spirit thereof and that these implementations, implementing components, sub-components, methods and sub-methods may be applied to other methods of singulating die.

What is claimed is:

1. A method of singulating a plurality of die, the method comprising:
   providing a semiconductor wafer comprising a plurality of die located on a first side of the semiconductor wafer, the plurality of die comprising a desired thickness, wherein a passivation material covers at least a portion of the plurality of die and the semiconductor wafer;
   clearing the passivation material from one or more die streets located between each of the plurality of die;
   etching a plurality of trenches into the semiconductor wafer only from the first side of the semiconductor wafer, the plurality of trenches located in the one or more die streets and adjacent a perimeter of the plurality of die and a depth of the plurality of trenches being greater than the desired thickness of the plurality of die;
   mounting the first side of the semiconductor wafer to a back grinding tape;
   thinning a second side of the semiconductor wafer to a predetermined distance to the depth of the plurality of trenches to singulate the plurality of die.

2. The method of claim 1, wherein etching the plurality of trenches comprises plasma etching.

3. The method of claim 1, wherein etching the plurality of trenches further comprises defining a pattern of the plurality of trenches using one of passivation material, metal material, photolithographic masking, temporary film, shadow masking, and any combination thereof.

4. The method of claim 1, wherein the semiconductor wafer comprises silicon and etching the plurality of trenches further comprises using a deep reactive ion etch (DRIE) process.

5. The method of claim 1, further comprising at least one of the following after etching the plurality of trenches:
   forming a plurality of bumps on the plurality of die;
   testing one or more of the plurality of die;
   probing one or more of the plurality of die;
   adding memory data to one or more of the plurality of die;
   forming a solderable surface on a surface of one or more of the plurality of die; or
   any combination thereof.

6. The method of claim 1, wherein thinning the second side of the semiconductor wafer to the depth of the trenches further comprises using an edge ring grinding process.

7. The method of claim 1, wherein clearing the passivation layer comprises one of sawing or laser cutting.

8. A method of singulating a plurality of die, the method comprising:
   providing a semiconductor wafer comprising a plurality of die located on a first side of the semiconductor wafer, the plurality of die comprising a desired thickness, wherein a passivation material covers at least a portion of the plurality of die and the semiconductor wafer;
   clearing the passivation material from one or more die streets located between each of the plurality of die;
   etching a plurality of trenches into the semiconductor wafer only from the first side of the semiconductor wafer, the plurality of trenches located in the one or more die streets and adjacent a perimeter of the plurality of die and a depth of the plurality of trenches being greater than the desired thickness of the plurality of die;
   forming a plurality of bumps on the plurality of die;
   mounting the first side of the semiconductor wafer to a back grinding tape;
   thinning a second side of the semiconductor wafer to a predetermined distance to the depth of the plurality of trenches to singulate the plurality of die.

9. The method of claim 8, wherein clearing the passivation layer comprises one of sawing or laser cutting.

10. The method of claim 8, wherein etching the plurality of trenches further comprises defining a pattern of the plurality of trenches using one of passivation material, metal material, photolithographic masking, temporary film, shadow masking, or any combination thereof.

11. The method of claim 8, wherein the semiconductor wafer comprises silicon and etching the plurality of trenches further comprise using a deep reactive ion etch (DRIE) process.

12. The method of claim 8, further comprising at least one of the following after etching the plurality of trenches:
   testing one or more of the plurality of die;
   probing one or more of the plurality of die;
   adding memory data to one or more of the plurality of die;

forming a solderable surface on a surface of one or more of the plurality of die; or any combination thereof.

13. The method of claim 8, wherein thinning the second side of the semiconductor wafer to the depth of the trenches further comprises using an edge ring grinding process.

14. A method of singulating a plurality of die, the method comprising:

provoding a semiconductor wafer comprising a plurality of die located on a first side of the semiconductor wafer, the plurality of die comprising a desired thickness, wherein a passivation material covers at least a portion the plurality of die and the semiconductor wafer;

clearing the passivation material from one or more die streets located between each of the plurality of die;

etching a plurality of trenches into the semiconductor wafer only from the first side of the semiconductor wafer, the plurality of trenches located in the one or more die streets and adjacent a perimeter of the plurality of die and a depth of the plurality of trenches being greater than the desired thickness of the plurality of die;

mounting the first side of the semiconductor wafer to a back grinding tape;

thinning a second side of the semiconductor wafer to the depth of the plurality of trenches;

singulating the plurality of die through thinning the second side of the semiconductor wafer; and transferring the plurality of die from the back grinding tape to a transporting tape.

15. The method of claim 14, wherein clearing the passivation layer comprises one of sawing or laser cutting.

16. The method of claim 14, wherein etching the plurality of trenches further comprises defining a pattern of the plurality of trenches using one of passivation material, metal material, photolithographic masking, temporary film, shadow masking, or any combination thereof.

17. The method of claim 14, wherein the semiconductor wafer comprises silicon and etching the plurality of trenches further comprises using a deep reactive ion etch (DRIE) process.

18. The method of claim 14, further comprising at least one of the following after etching the plurality of trenches:

forming a plurality of bumps on the plurality of die;

testing one or more of the plurality of die;

probing one or more of the plurality of die;

adding memory data to one or more of the plurality of die;

forming a solderable surface on a surface of one or more of the plurality of die; or any combination thereof.

19. The method of claim 14, wherein thinning the second side of the semiconductor wafer to the depth of the trenches further comprises using an edge ring grinding process.

20. The method of claim 14, further comprising picking the plurality of die from the transporting tape.

* * * * *